US010008469B2

(12) United States Patent
Katkar et al.

(10) Patent No.: US 10,008,469 B2
(45) Date of Patent: Jun. 26, 2018

(54) WAFER-LEVEL PACKAGING USING WIRE BOND WIRES IN PLACE OF A REDISTRIBUTION LAYER

(71) Applicant: Invensas Corporation, San Jose, CA (US)

(72) Inventors: Rajesh Katkar, San Jose, CA (US); Tu Tam Vu, San Jose, CA (US); Bongsub Lee, Mountain View, CA (US); Kyong-Mo Bang, Fremont, CA (US); Xuan Li, Santa Clara, CA (US); Long Huynh, Santa Clara, CA (US); Gabriel Z. Guevara, San Jose, CA (US); Akash Agrawal, San Jose, CA (US); Willmar Subido, San Jose, CA (US); Laura Wills Mirkarimi, Sunol, CA (US)

(73) Assignee: Invensas Corporation, San Jose, CA (US)

( * ) Notice: Subject to any disclaimer, the term of this patent is extended or adjusted under 35 U.S.C. 154(b) by 0 days. days.

(21) Appl. No.: 15/357,553

(22) Filed: Nov. 21, 2016

(65) Prior Publication Data

US 2017/0069591 A1    Mar. 9, 2017

Related U.S. Application Data

(63) Continuation of application No. 14/701,049, filed on Apr. 30, 2015, now Pat. No. 9,502,372.

(51) Int. Cl.
*H01L 23/00*   (2006.01)
*H01L 23/31*   (2006.01)
(Continued)

(52) U.S. Cl.
CPC .......... *H01L 24/49* (2013.01); *H01L 21/486* (2013.01); *H01L 21/561* (2013.01);
(Continued)

(58) Field of Classification Search
CPC .................. H01L 2224/4824; H01L 24/96; H01L 21/486
See application file for complete search history.

(56) References Cited

U.S. PATENT DOCUMENTS 2,230,663 A    2/1941   Alden
3,289,452 A   12/1966   Koellner
(Continued)

FOREIGN PATENT DOCUMENTS

CN    1352804 A    6/2002
CN    1641832 A    7/2005
(Continued)

OTHER PUBLICATIONS

U.S. Appl. No. 13/477,532, mailed May 22, 2012.
(Continued)

*Primary Examiner* — Moazzam Hossain
*Assistant Examiner* — Farun Lu

(57) ABSTRACT

An apparatus relates generally to a microelectronic package. In such an apparatus, a microelectronic die has a first surface, a second surface opposite the first surface, and a sidewall surface between the first and second surfaces. A plurality of wire bond wires with proximal ends thereof are coupled to either the first surface or the second surface of the microelectronic die with distal ends of the plurality of wire bond wires extending away from either the first surface or the second surface, respectively, of the microelectronic die. A portion of the plurality of wire bond wires extends outside a perimeter of the microelectronic die into a fan-out ("FO") region. A molding material covers the first surface, the sidewall surface, and portions of the plurality of the wire bond wires from the first surface of the microelectronic die to an outer surface of the molding material.

13 Claims, 8 Drawing Sheets

(51) Int. Cl.
  *H01L 25/065* (2006.01)
  *H01L 21/56* (2006.01)
  *H01L 21/78* (2006.01)
  *H01L 23/538* (2006.01)
  *H01L 25/10* (2006.01)
  *H01L 25/00* (2006.01)
  *H01L 23/498* (2006.01)
  *H01L 21/48* (2006.01)

(52) U.S. Cl.
  CPC ............ *H01L 21/565* (2013.01); *H01L 21/78* (2013.01); *H01L 23/3114* (2013.01); *H01L 23/49827* (2013.01); *H01L 23/5389* (2013.01); *H01L 24/19* (2013.01); *H01L 24/20* (2013.01); *H01L 24/48* (2013.01); *H01L 24/85* (2013.01); *H01L 24/96* (2013.01); *H01L 24/97* (2013.01); *H01L 25/0657* (2013.01); *H01L 25/105* (2013.01); *H01L 25/50* (2013.01); *H01L 21/568* (2013.01); *H01L 2224/04105* (2013.01); *H01L 2224/12105* (2013.01); *H01L 2224/32145* (2013.01); *H01L 2224/32225* (2013.01); *H01L 2224/33181* (2013.01); *H01L 2224/4801* (2013.01); *H01L 2224/484* (2013.01); *H01L 2224/4845* (2013.01); *H01L 2224/48235* (2013.01); *H01L 2224/49171* (2013.01); *H01L 2224/49173* (2013.01); *H01L 2224/49177* (2013.01); *H01L 2224/73217* (2013.01); *H01L 2224/73267* (2013.01); *H01L 2224/85005* (2013.01); *H01L 2224/92244* (2013.01); *H01L 2224/97* (2013.01); *H01L 2225/0651* (2013.01); *H01L 2225/06506* (2013.01); *H01L 2225/1035* (2013.01); *H01L 2225/1041* (2013.01); *H01L 2225/1058* (2013.01); *H01L 2924/00014* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/14* (2013.01); *H01L 2924/181* (2013.01); *H01L 2924/18162* (2013.01); *H01L 2924/2064* (2013.01)

(56) References Cited

U.S. PATENT DOCUMENTS

| | | |
|---|---|---|
| 3,358,897 A | 12/1967 | Christensen |
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman et al. |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | DiFrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,454 A | 8/1993 | Ameen et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,476,211 A | 12/1995 | Khandros |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |

(56) References Cited

U.S. PATENT DOCUMENTS

| | | |
|---|---|---|
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,469,373 B2 | 10/2002 | Funakura et al. |
| 6,472,743 B2 | 10/2002 | Huang et al. |
| 6,476,503 B1 | 11/2002 | Imamura et al. |
| 6,476,506 B1 | 11/2002 | O'Connor |
| 6,476,583 B2 | 11/2002 | McAndrews |
| 6,486,545 B1 | 11/2002 | Glenn et al. |
| 6,489,182 B2 | 12/2002 | Kwon |
| 6,489,676 B2 | 12/2002 | Taniguchi et al. |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,550,666 B2 | 2/2003 | Chew et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,555,918 B2 | 4/2003 | Masuda et al. |
| 6,560,117 B2 | 5/2003 | Moon |
| 6,563,205 B1 | 5/2003 | Fogal et al. |
| 6,563,217 B2 | 5/2003 | Corisis et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2 | 2/2004 | Farnworth et al. |
| 6,687,988 B1 | 2/2004 | Sugiura et al. |
| 6,693,363 B2 | 2/2004 | Tay et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2 | 4/2004 | Satoh et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,740,981 B2 | 5/2004 | Hosomi |
| 6,741,085 B1 | 5/2004 | Khandros et al. |
| 6,746,894 B2 | 6/2004 | Fee et al. |
| 6,754,407 B2 | 6/2004 | Chakravorty et al. |
| 6,756,252 B2 | 6/2004 | Nakanishi |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,317 B2 | 8/2004 | Fjelstad |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,780,746 B2 | 8/2004 | Kinsman et al. |
| 6,787,926 B2 | 9/2004 | Chen et al. |
| 6,790,757 B1 | 9/2004 | Chillipeddi et al. |
| 6,800,941 B2 | 10/2004 | Lee et al. |
| 6,812,575 B2 | 11/2004 | Furusawa |
| 6,815,257 B2 | 11/2004 | Yoon et al. |
| 6,825,552 B2 | 11/2004 | Light et al. |
| 6,828,665 B2 | 12/2004 | Pu et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,908,785 B2 | 6/2005 | Kim |
| 6,909,181 B2 | 6/2005 | Aiba et al. |
| 6,917,098 B1 | 7/2005 | Yamunan |
| 6,930,256 B1 | 8/2005 | Huemoeller et al. |
| 6,933,598 B2 | 8/2005 | Kamezos |
| 6,933,608 B2 | 8/2005 | Fujisawa |
| 6,939,723 B2 | 9/2005 | Corisis et al. |
| 6,946,380 B2 | 9/2005 | Takahashi |
| 6,951,773 B2 | 10/2005 | Ho et al. |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,017,794 B2 | 3/2006 | Nosaka |
| 7,021,521 B2 | 4/2006 | Sakurai et al. |
| 7,045,884 B2 | 5/2006 | Standing |
| 7,051,915 B2 | 5/2006 | Mutaguchi |
| 7,052,935 B2 | 5/2006 | Pai et al. |
| 7,053,477 B2 | 5/2006 | Kamezos et al. |
| 7,053,485 B2 | 5/2006 | Bang et al. |
| 7,061,079 B2 | 6/2006 | Weng et al. |

(56) References Cited

U.S. PATENT DOCUMENTS

| | | |
|---|---|---|
| 7,061,097 B2 | 6/2006 | Yokoi |
| 7,067,911 B1 | 6/2006 | Lin et al. |
| 7,071,028 B2 | 7/2006 | Koike et al. |
| 7,071,547 B2 | 7/2006 | Kang et al. |
| 7,071,573 B1 | 7/2006 | Lin |
| 7,078,788 B2 | 7/2006 | Vu et al. |
| 7,078,822 B2 | 7/2006 | Dias et al. |
| 7,095,105 B2 | 8/2006 | Cherukuri et al. |
| 7,112,520 B2 | 9/2006 | Lee et al. |
| 7,115,986 B2 | 10/2006 | Moon et al. |
| 7,119,427 B2 | 10/2006 | Kim |
| 7,121,891 B2 | 10/2006 | Cherian |
| 7,138,722 B2 | 11/2006 | Miyamoto et al. |
| 7,170,185 B1 | 1/2007 | Hogerton et al. |
| 7,176,043 B2 | 2/2007 | Haba et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,187,072 B2 | 3/2007 | Fukitomi et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,216,794 B2 | 5/2007 | Lange et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,256,069 B2 | 8/2007 | Akram et al. |
| 7,259,445 B2 | 8/2007 | Lau et al. |
| 7,262,124 B2 | 8/2007 | Fujisawa |
| 7,262,506 B2 | 8/2007 | Mess et al. |
| 7,268,421 B1 | 9/2007 | Lin |
| 7,276,799 B2 | 10/2007 | Lee et al. |
| 7,287,322 B2 | 10/2007 | Mahieu et al. |
| 7,290,448 B2 | 11/2007 | Shirasaka et al. |
| 7,294,920 B2 | 11/2007 | Chen et al. |
| 7,294,928 B2 | 11/2007 | Bang et al. |
| 7,298,033 B2 | 11/2007 | Yoo |
| 7,301,770 B2 | 11/2007 | Campbell et al. |
| 7,307,348 B2 | 12/2007 | Wood et al. |
| 7,321,164 B2 | 1/2008 | Hsu |
| 7,323,767 B2 | 1/2008 | James et al. |
| 7,327,038 B2 | 2/2008 | Kwon et al. |
| 7,342,803 B2 | 3/2008 | Inagaki et al. |
| 7,344,917 B2 | 3/2008 | Gautham |
| 7,345,361 B2 | 3/2008 | Malik et al. |
| 7,355,289 B2 | 4/2008 | Hess et al. |
| 7,365,416 B2 | 4/2008 | Kawabata et al. |
| 7,368,924 B2 | 5/2008 | Beaman et al. |
| 7,371,676 B2 | 5/2008 | Hembree |
| 7,372,151 B1 | 5/2008 | Fan et al. |
| 7,378,726 B2 | 5/2008 | Punzalan et al. |
| 7,390,700 B2 | 6/2008 | Gerber et al. |
| 7,391,105 B2 | 6/2008 | Yeom |
| 7,391,121 B2 | 6/2008 | Otremba |
| 7,416,107 B2 | 8/2008 | Chapman et al. |
| 7,425,758 B2 | 9/2008 | Corisis et al. |
| 7,453,157 B2 | 11/2008 | Haba et al. |
| 7,456,091 B2 | 11/2008 | Kuraya et al. |
| 7,456,495 B2 | 11/2008 | Pohl et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,179 B2 | 2/2009 | Kubota et al. |
| 7,495,342 B2 | 2/2009 | Beaman et al. |
| 7,495,644 B2 | 2/2009 | Hirakata |
| 7,504,284 B2 | 3/2009 | Ye et al. |
| 7,504,716 B2 | 3/2009 | Abbott |
| 7,517,733 B2 | 4/2009 | Camacho et al. |
| 7,527,505 B2 | 5/2009 | Murata |
| 7,528,474 B2 | 5/2009 | Lee |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,564,116 B2 | 7/2009 | Ahn et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,595,548 B2 | 9/2009 | Shirasaka et al. |
| 7,605,479 B2 | 10/2009 | Mohammed |
| 7,621,436 B2 | 11/2009 | Mii et al. |
| 7,625,781 B2 | 12/2009 | Beer |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,659,617 B2 | 2/2010 | Kang et al. |
| 7,663,226 B2 | 2/2010 | Cho et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,960 B2 | 3/2010 | Wen |
| 7,682,962 B2 | 3/2010 | Hembree |
| 7,683,460 B2 | 3/2010 | Heitzer et al. |
| 7,683,482 B2 | 3/2010 | Nishida et al. |
| 7,692,931 B2 | 4/2010 | Chong et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,723,839 B2 | 5/2010 | Yano et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,807,512 B2 | 10/2010 | Lee et al. |
| 7,808,093 B2 | 10/2010 | Kagaya et al. |
| 7,834,464 B2 | 11/2010 | Meyer et al. |
| 7,838,334 B2 | 11/2010 | Yu et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,855,464 B2 | 12/2010 | Shikano |
| 7,857,190 B2 | 12/2010 | Takahashi et al. |
| 7,859,033 B2 | 12/2010 | Brady |
| 7,872,335 B2 | 1/2011 | Khan et al. |
| 7,880,290 B2 | 2/2011 | Park |
| 7,892,889 B2 | 2/2011 | Howard et al. |
| 7,898,083 B2 | 3/2011 | Castro |
| 7,901,989 B2 | 3/2011 | Haba et al. |
| 7,902,644 B2 | 3/2011 | Huang et al. |
| 7,902,652 B2 | 3/2011 | Sec et al. |
| 7,910,385 B2 | 3/2011 | Kweon et al. |
| 7,911,805 B2 | 3/2011 | Haba |
| 7,919,846 B2 | 4/2011 | Hembree |
| 7,919,871 B2 | 4/2011 | Moon et al. |
| 7,923,295 B2 | 4/2011 | Shim et al. |
| 7,923,304 B2 | 4/2011 | Choi et al. |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,944,034 B2 | 5/2011 | Gerber et al. |
| 7,956,456 B2 | 6/2011 | Gurrum et al. |

(56) References Cited

U.S. PATENT DOCUMENTS

| | | |
|---|---|---|
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 7,994,622 B2 | 8/2011 | Mohammed et al. |
| 8,004,074 B2 | 8/2011 | Mori et al. |
| 8,004,093 B2 | 8/2011 | Oh et al. |
| 8,008,121 B2 | 8/2011 | Choi et al. |
| 8,012,797 B2 | 9/2011 | Shen et al. |
| 8,017,437 B2 | 9/2011 | Yoo et al. |
| 8,017,452 B2 | 9/2011 | Ishihara et al. |
| 8,018,033 B2 | 9/2011 | Moriya |
| 8,018,065 B2 | 9/2011 | Lam |
| 8,020,290 B2 | 9/2011 | Sheats |
| 8,021,907 B2 | 9/2011 | Pagaila et al. |
| 8,035,213 B2 | 10/2011 | Lee et al. |
| 8,039,316 B2 | 10/2011 | Chi et al. |
| 8,039,960 B2 | 10/2011 | Lin |
| 8,039,970 B2 | 10/2011 | Yamamori et al. |
| 8,048,479 B2 | 11/2011 | Hedler et al. |
| 8,053,814 B2 | 11/2011 | Chen et al. |
| 8,053,879 B2 | 11/2011 | Lee et al. |
| 8,053,906 B2 | 11/2011 | Chang et al. |
| 8,058,101 B2 | 11/2011 | Haba et al. |
| 8,063,475 B2 | 11/2011 | Choi et al. |
| 8,071,424 B2 | 12/2011 | Kang et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,106,498 B2 | 1/2012 | Shin et al. |
| 8,115,283 B1 | 2/2012 | Bolognia et al. |
| 8,119,516 B2 | 2/2012 | Endo |
| 8,120,054 B2 | 2/2012 | Seo et al. |
| 8,120,186 B2 | 2/2012 | Yoon |
| 8,138,584 B2 | 3/2012 | Wang et al. |
| 8,143,141 B2 | 3/2012 | Sun et al. |
| 8,143,710 B2 | 3/2012 | Cho |
| 8,158,888 B2 | 4/2012 | Shen et al. |
| 8,169,065 B2 | 5/2012 | Kohl et al. |
| 8,174,119 B2 | 5/2012 | Pendse |
| 8,183,682 B2 | 5/2012 | Groenhuis et al. |
| 8,183,684 B2 | 5/2012 | Nakazato |
| 8,193,034 B2 | 6/2012 | Pagaila et al. |
| 8,194,411 B2 | 6/2012 | Leung et al. |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,225,982 B2 | 7/2012 | Pirkle et al. |
| 8,232,141 B2 | 7/2012 | Choi et al. |
| 8,237,257 B2 | 8/2012 | Yang |
| 8,258,010 B2 | 9/2012 | Pagaila et al. |
| 8,258,015 B2 | 9/2012 | Chow et al. |
| 8,263,435 B2 | 9/2012 | Choi et al. |
| 8,264,091 B2 | 9/2012 | Cho et al. |
| 8,269,335 B2 | 9/2012 | Osumi |
| 8,278,746 B2 | 10/2012 | Ding et al. |
| 8,288,854 B2 | 10/2012 | Weng et al. |
| 8,293,580 B2 | 10/2012 | Kim et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,318,539 B2 | 11/2012 | Cho et al. |
| 8,319,338 B1 | 11/2012 | Berry et al. |
| 8,324,633 B2 | 12/2012 | McKenzie et al. |
| 8,330,272 B2 | 12/2012 | Haba |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 * | 2/2013 | Co .................... H01L 24/03 438/617 |
| 8,390,108 B2 | 3/2013 | Cho et al. |
| 8,390,117 B2 | 3/2013 | Shimizu et al. |
| 8,395,259 B2 | 3/2013 | Eun |
| 8,399,972 B2 | 3/2013 | Hoang et al. |
| 8,404,520 B1 | 3/2013 | Chau et al. |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,435,899 B2 | 5/2013 | Miyata et al. |
| 8,450,839 B2 | 5/2013 | Corisis et al. |
| 8,476,115 B2 | 7/2013 | Choi et al. |
| 8,476,770 B2 | 7/2013 | Shao et al. |
| 8,482,111 B2 | 7/2013 | Haba |
| 8,487,421 B2 | 7/2013 | Sato et al. |
| 8,492,201 B2 | 7/2013 | Pagaila et al. |
| 8,502,387 B2 | 8/2013 | Choi et al. |
| 8,507,297 B2 | 8/2013 | Iida et al. |
| 8,508,045 B2 | 8/2013 | Khan et al. |
| 8,518,746 B2 | 8/2013 | Pagaila et al. |
| 8,520,396 B2 | 8/2013 | Schmidt et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,379 B2 | 10/2013 | Kwon |
| 8,558,392 B2 | 10/2013 | Chua et al. |
| 8,564,141 B2 | 10/2013 | Lee et al. |
| 8,567,051 B2 | 10/2013 | Val |
| 8,569,892 B2 | 10/2013 | Mori et al. |
| 8,580,607 B2 | 11/2013 | Haba |
| 8,598,717 B2 | 12/2013 | Masuda |
| 8,618,646 B2 | 12/2013 | Sasaki et al. |
| 8,618,659 B2 | 12/2013 | Sato et al. |
| 8,624,374 B2 | 1/2014 | Ding et al. |
| 8,637,991 B2 | 1/2014 | Haba |
| 8,642,393 B1 | 2/2014 | Yu et al. |
| 8,646,508 B2 | 2/2014 | Kawada |
| 8,653,626 B2 | 2/2014 | Lo et al. |
| 8,653,668 B2 | 2/2014 | Uno et al. |
| 8,653,676 B2 | 2/2014 | Kim et al. |
| 8,659,164 B2 | 2/2014 | Haba |
| 8,664,780 B2 | 3/2014 | Han et al. |
| 8,669,646 B2 | 3/2014 | Tabatabai et al. |
| 8,670,261 B2 | 3/2014 | Crisp et al. |
| 8,680,662 B2 | 3/2014 | Haba et al. |
| 8,680,677 B2 | 3/2014 | Wyland |
| 8,680,684 B2 | 3/2014 | Haba et al. |
| 8,685,792 B2 | 4/2014 | Chow et al. |
| 8,697,492 B2 | 4/2014 | Haba et al. |
| 8,723,307 B2 | 5/2014 | Jiang et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson |
| 8,766,436 B2 | 7/2014 | Delucca et al. |
| 8,772,152 B2 | 7/2014 | Co et al. |
| 8,772,817 B2 | 7/2014 | Yao |
| 8,785,245 B2 | 7/2014 | Kim |
| 8,791,575 B2 | 7/2014 | Oganesian et al. |
| 8,791,580 B2 | 7/2014 | Park et al. |
| 8,796,846 B2 | 8/2014 | Lin et al. |
| 8,802,494 B2 | 8/2014 | Lee et al. |
| 8,810,031 B2 | 8/2014 | Chang et al. |
| 8,811,055 B2 | 8/2014 | Yoon |
| 8,816,404 B2 | 8/2014 | Kim et al. |
| 8,835,228 B2 | 9/2014 | Mohammed |
| 8,836,136 B2 | 9/2014 | Chau et al. |
| 8,836,140 B2 | 9/2014 | Ma et al. |
| 8,836,147 B2 | 9/2014 | Uno et al. |
| 8,841,765 B2 | 9/2014 | Haba et al. |
| 8,846,521 B2 | 9/2014 | Sugizaki |
| 8,847,376 B2 | 9/2014 | Oganesian et al. |
| 8,853,558 B2 | 10/2014 | Gupta et al. |
| 8,878,353 B2 | 11/2014 | Haba et al. |
| 8,884,416 B2 | 11/2014 | Lee et al. |

(56) References Cited

U.S. PATENT DOCUMENTS

| | | |
|---|---|---|
| 8,893,380 B2 | 11/2014 | Kim et al. |
| 8,907,466 B2 | 12/2014 | Haba |
| 8,907,500 B2 | 12/2014 | Haba et al. |
| 8,912,651 B2 | 12/2014 | Yu et al. |
| 8,916,781 B2 | 12/2014 | Haba et al. |
| 8,922,005 B2 | 12/2014 | Hu et al. |
| 8,923,004 B2 | 12/2014 | Low et al. |
| 8,927,337 B2 | 1/2015 | Haba et al. |
| 8,937,309 B2 | 1/2015 | England et al. |
| 8,940,630 B2 | 1/2015 | Damberg et al. |
| 8,940,636 B2 | 1/2015 | Pagaila et al. |
| 8,946,757 B2 | 2/2015 | Mohammed et al. |
| 8,948,712 B2 | 2/2015 | Chen et al. |
| 8,963,339 B2 | 2/2015 | He et al. |
| 8,970,049 B2 | 3/2015 | Kamezos |
| 8,975,726 B2 | 3/2015 | Chen |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,006,031 B2 | 4/2015 | Camacho et al. |
| 9,012,263 B1 | 4/2015 | Mathew et al. |
| 9,041,227 B2 | 5/2015 | Chau et al. |
| 9,054,095 B2 | 6/2015 | Pagaila |
| 9,082,763 B2 | 7/2015 | Yu et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,105,552 B2 | 8/2015 | Yu et al. |
| 9,117,811 B2 | 8/2015 | Zohni |
| 9,123,664 B2 | 9/2015 | Haba |
| 9,136,254 B2 | 9/2015 | Zhao et al. |
| 9,142,586 B2 | 9/2015 | Wang et al. |
| 9,153,562 B2 | 10/2015 | Haba et al. |
| 9,171,790 B2 | 10/2015 | Yu et al. |
| 9,177,832 B2 | 11/2015 | Camacho |
| 9,196,586 B2 | 11/2015 | Chen et al. |
| 9,196,588 B2 | 11/2015 | Leal |
| 9,214,434 B1 | 12/2015 | Kim et al. |
| 9,224,647 B2 | 12/2015 | Koo et al. |
| 9,224,717 B2 | 12/2015 | Sato et al. |
| 9,258,922 B2 | 2/2016 | Chen et al. |
| 9,263,394 B2 | 2/2016 | Uzoh et al. |
| 9,263,413 B2 | 2/2016 | Mohammed |
| 9,299,670 B2 | 3/2016 | Yap et al. |
| 9,318,452 B2 | 4/2016 | Chen et al. |
| 9,324,696 B2 | 4/2016 | Choi et al. |
| 9,330,945 B2 | 5/2016 | Song et al. |
| 9,349,706 B2 | 5/2016 | Co et al. |
| 9,362,161 B2 | 6/2016 | Chi et al. |
| 9,378,982 B2 | 6/2016 | Lin et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,412,661 B2 | 8/2016 | Lu et al. |
| 9,418,940 B2 | 8/2016 | Hoshino et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,496,152 B2 | 11/2016 | Cho et al. |
| 9,502,390 B2 | 11/2016 | Caskey et al. |
| 9,508,622 B2 | 11/2016 | Higgins |
| 9,559,088 B2 | 1/2017 | Gonzalez et al. |
| 9,570,382 B2 | 2/2017 | Haba |
| 9,583,456 B2 | 2/2017 | Uzoh et al. |
| 9,601,454 B2 | 3/2017 | Zhao et al. |
| 2001/0042925 A1 | 11/2001 | Yamamoto et al. |
| 2002/0014004 A1 | 2/2002 | Beaman et al. |
| 2002/0125556 A1 | 9/2002 | Oh et al. |
| 2002/0171152 A1 | 11/2002 | Miyazaki |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0162378 A1 | 8/2003 | Mikami |
| 2004/0041757 A1 | 3/2004 | Yang et al. |
| 2004/0262728 A1 | 12/2004 | Sterrett et al. |
| 2005/0017369 A1 | 1/2005 | Clayton et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0161814 A1 | 7/2005 | Mizukoshi et al. |
| 2005/0173807 A1 | 8/2005 | Zhu et al. |
| 2005/0176233 A1 | 8/2005 | Joshi et al. |
| 2006/0087013 A1 | 4/2006 | Hsieh |
| 2006/0216868 A1 | 9/2006 | Yang et al. |
| 2006/0255449 A1 | 11/2006 | Lee et al. |
| 2007/0010086 A1 | 1/2007 | Hsieh |
| 2007/0080360 A1 | 4/2007 | Mirsky et al. |
| 2007/0164457 A1 | 7/2007 | Yamaguchi et al. |
| 2007/0190747 A1 | 8/2007 | Hup |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0042265 A1 | 2/2008 | Merilo et al. |
| 2008/0047741 A1 | 2/2008 | Beaman et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0217708 A1 | 9/2008 | Reisner et al. |
| 2008/0280393 A1 | 11/2008 | Lee et al. |
| 2008/0284045 A1 | 11/2008 | Gerber et al. |
| 2008/0303153 A1 | 12/2008 | Oi et al. |
| 2008/0308305 A1 | 12/2008 | Kawabe |
| 2009/0008796 A1 | 1/2009 | Eng et al. |
| 2009/0014876 A1 | 1/2009 | Youn et al. |
| 2009/0032913 A1 | 2/2009 | Haba |
| 2009/0085185 A1 | 4/2009 | Byun et al. |
| 2009/0091009 A1 | 4/2009 | Corisis et al. |

(56) References Cited

U.S. PATENT DOCUMENTS

| | | |
|---|---|---|
| 2009/0102063 A1 | 4/2009 | Lee et al. |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0166664 A1 | 7/2009 | Park et al. |
| 2009/0166873 A1 | 7/2009 | Yang et al. |
| 2009/0189288 A1 | 7/2009 | Beaman et al. |
| 2009/0194829 A1 | 8/2009 | Chung et al. |
| 2009/0256229 A1 | 10/2009 | Ishikawa et al. |
| 2009/0315579 A1 | 12/2009 | Beaman et al. |
| 2010/0032822 A1 | 2/2010 | Liao et al. |
| 2010/0044860 A1 | 2/2010 | Haba et al. |
| 2010/0078795 A1 | 4/2010 | Dekker et al. |
| 2010/0193937 A1 | 8/2010 | Nagamatsu et al. |
| 2010/0200981 A1 | 8/2010 | Huang et al. |
| 2010/0258955 A1 | 10/2010 | Miyagawa et al. |
| 2010/0289142 A1 | 11/2010 | Shim et al. |
| 2010/0314748 A1* | 12/2010 | Hsu .................. H01L 21/56 257/693 |
| 2010/0327419 A1 | 12/2010 | Muthukumar et al. |
| 2011/0042699 A1 | 2/2011 | Park et al. |
| 2011/0068478 A1 | 3/2011 | Pagaila et al. |
| 2011/0157834 A1 | 6/2011 | Wang |
| 2011/0209908 A1 | 9/2011 | Lin et al. |
| 2011/0215472 A1 | 9/2011 | Chandrasekaran |
| 2012/0001336 A1 | 1/2012 | Zeng et al. |
| 2012/0043655 A1 | 2/2012 | Khor et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0126431 A1 | 5/2012 | Kim et al. |
| 2012/0153444 A1 | 6/2012 | Haga et al. |
| 2012/0184116 A1 | 7/2012 | Pawlikowski et al. |
| 2013/0001797 A1 | 1/2013 | Choi et al. |
| 2013/0040423 A1 | 2/2013 | Tung |
| 2013/0049218 A1 | 2/2013 | Gong et al. |
| 2013/0087915 A1 | 4/2013 | Warren et al. |
| 2013/0153646 A1 | 6/2013 | Ho |
| 2013/0200524 A1 | 8/2013 | Han et al. |
| 2013/0234317 A1 | 9/2013 | Chen et al. |
| 2013/0256847 A1 | 10/2013 | Park et al. |
| 2013/0323409 A1 | 12/2013 | Read et al. |
| 2013/0328178 A1 | 12/2013 | Bakalski et al. |
| 2014/0035892 A1 | 2/2014 | Shenoy et al. |
| 2014/0103527 A1 | 4/2014 | Marimuthu et al. |
| 2014/0124949 A1 | 5/2014 | Paek et al. |
| 2014/0175657 A1 | 6/2014 | Oka et al. |
| 2014/0225248 A1 | 8/2014 | Henderson et al. |
| 2014/0231980 A1* | 8/2014 | Lim .................. H01L 21/78 257/690 |
| 2014/0239479 A1 | 8/2014 | Start |
| 2014/0239490 A1 | 8/2014 | Wang |
| 2014/0308907 A1 | 10/2014 | Chen |
| 2014/0312503 A1 | 10/2014 | Seo |
| 2015/0044823 A1 | 2/2015 | Mohammed |
| 2015/0076714 A1 | 3/2015 | Haba et al. |
| 2015/0130054 A1 | 5/2015 | Lee et al. |
| 2015/0206865 A1 | 7/2015 | Yu et al. |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0172268 A1 | 6/2016 | Katkar et al. |
| 2016/0200566 A1 | 7/2016 | Ofner et al. |
| 2016/0225692 A1 | 8/2016 | Kim et al. |
| 2017/0117231 A1 | 4/2017 | Awujoola et al. |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| DE | 102009001461 A1 | 9/2010 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 A | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | 1118364 | 5/1989 |
| JP | H04-346436 A | 12/1992 |
| JP | 06268015 A | 9/1994 |
| JP | H06268101 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10135220 A | 5/1998 |
| JP | H10135221 A | 5/1998 |
| JP | 11-074295 A | 3/1999 |
| JP | 11135663 A | 5/1999 |
| JP | H11-145323 A | 5/1999 |
| JP | 11251350 A | 9/1999 |
| JP | H11260856 A | 9/1999 |
| JP | 11317476 | 11/1999 |
| JP | 2000323516 A | 11/2000 |
| JP | 2001196407 A | 7/2001 |
| JP | 2001326236 A | 11/2001 |
| JP | 2002050871 A | 2/2002 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2003318327 A | 11/2003 |
| JP | 2004031754 A | 1/2004 |
| JP | 2004047702 A | 2/2004 |
| JP | 2004048048 A | 2/2004 |
| JP | 2004-172157 A | 6/2004 |
| JP | 2004-200316 | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005093551 A | 4/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 5/2007 |
| JP | 2007123595 A | 5/2007 |
| JP | 2007-208159 A | 8/2007 |
| JP | 2007194436 A | 8/2007 |
| JP | 2007234845 A | 9/2007 |
| JP | 2007287922 A | 11/2007 |
| JP | 2007-335464 | 12/2007 |
| JP | 200834534 A | 2/2008 |
| JP | 2008166439 A | 7/2008 |
| JP | 2008171938 A | 7/2008 |
| JP | 2008235378 A | 10/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009044110 A | 2/2009 |
| JP | 2009506553 | 2/2009 |
| JP | 2009508324 A | 2/2009 |
| JP | 2009064966 A | 3/2009 |
| JP | 2009088254 A | 4/2009 |

(56) References Cited

FOREIGN PATENT DOCUMENTS

| | | |
|---|---|---|
| JP | 2009111384 A | 5/2009 |
| JP | 2009528706 A | 8/2009 |
| JP | 2009260132 A | 11/2009 |
| JP | 2010103129 A | 5/2010 |
| JP | 2010135671 A | 6/2010 |
| JP | 2010192928 A | 9/2010 |
| JP | 2010199528 A | 9/2010 |
| JP | 2010206007 A | 9/2010 |
| JP | 2011514015 A | 4/2011 |
| JP | 2011166051 A | 8/2011 |
| KR | 100265563 A1 | 9/2000 |
| KR | 20010061849 A | 7/2001 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 10-2007-0058680 A | 6/2007 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 10-2010-0050750 A | 5/2010 |
| KR | 20100062315 A | 6/2010 |
| KR | 101011863 B1 | 1/2011 |
| KR | 20120075855 A | 7/2012 |
| KR | 20150012285 A | 2/2015 |
| TW | 200539406 A | 12/2005 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| WO | 02-13256 A1 | 2/2002 |
| WO | 03-045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010014103 A1 | 2/2010 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

U.S. Office Action for U.S. Appl. No. 12/769,930, dated May 5, 2011.
"Wafer Level Stack—WDoD", [online] [Retrieved Aug. 5, 2010] Retrieved from internet: <http://www.3d-plus.com/techno-wafer-level-stack-wdod.php>, 2 pages.
Written Opinion for Appln. No. PCT/US2014/050125, dated Jul. 15, 2015.
Yoon, PhD, Seung Wook, "Next Generation Wafer Level Packaging Solution for 3D Integration," May 2010, STATS ChipPAC Ltd.
International Search Report and Written Opinion for Appln. No. PCT/US2013/041981, dated Nov. 13, 2013.
International Search Report and Written Opinion for Appln. No. PCT/US2013/053437, dated Nov. 25, 2013.
International Search Report and Written Opinion for Appln. No. PCT/US2013/075672, dated Apr. 22, 2014.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2015/011715, dated Apr. 20, 2015.
International Search Report and Written Opinion for Appln. No. PCT/US2014/055695, dated Dec. 15, 2015.
International Search Report and Written Opinion for Appln. No. PCT/US2016/056402, dated Jan. 31, 2017.
Japanese Office Action for Appln. No. 2013-509325, dated Oct. 18, 2013.
Japanese Office Action for Appln. No. 2013-520776, dated Apr. 21, 2015.
Japanese Office Action for Appln. No. 2013-520777, dated May 22, 2015.
Jin, Yonggang et al., "STM 3D-IC Package and 3D eWLB Development," STMicroelectronics Singapore/STMicroelectronics France, May 21, 2010.
Kim et al., "Application of Through Mold Via (TMV) as PoP Base Package," 2008, 6 pages.
Korean Office Action for Appn. 10-2011-0041843, dated Jun. 20, 2011.
Korean Office Action for Appn. 2014-7025992, dated Feb. 5, 2015.
Korean Search Report KR10-2010-0113271, dated Jan. 12, 2011.
Korean Search Report KR10-2011-0041843, dated Feb. 24, 2011.
Meiser, S., "Klein Und Komplex," Elektronik Irl Press Ltd, DE, vol. 41, No. 1, Jan. 7, 1992 (Jan. 7, 1992) pp. 72-77, XP000277326, [ISR Appln. No. PCT/US2012/060402, dated Feb. 21, 2013 provides concise stmt. of relevance).
Neo-Manhattan Technology, A Novel HDI Manufacturing Process, "High-Density Interconnects for Advanced Flex Substrates and 3-D Package Stacking," IPC Flex & Chips Symposium, Tempe, AZ, Feb. 11-12, 2003.
North Corporation, Processed intra-Layer Interconnection Material for PWBs [Etched Copper Bump with Copper Foil], NMBITM, Version 2001.6.
NTK HTCC Package General Design Guide, Communication Media Components Group, NGK Spark Plug Co., Ltd., Komaki, Aichi, Japan, Apr. 2010, 32 pages.
Partial International Search Report from Invitation to Pay Additional Fees for Appln. No. PCT/US2012/028738, dated Jun. 6, 2012.
Partial International Search Report for Appln. No. PCT/US2012/060402, dated Feb. 21, 2013.
Partial International Search Report for Appln. No. PCT/US2013/026126, dated Jun. 17, 2013.
Partial International Search Report for Appln. No. PCT/US2013/075672, dated Mar. 12, 2014.
Partial International Search Report for Appln. No. PCT/US2014/014181, dated May 8, 2014.
Partial International Search Report for Appln. No. PCT/US2015/033004, dated Sep. 9, 2015.
Redistributed Chip Package (RCP) Technology, Freescale Semiconductor, 2005, 6 pages.
Taiwan Office Action for 100125521, dated Dec. 20, 2013.
Taiwan Office Action for 100125522, dated Jan. 27, 2014.
Taiwan Office Action for 100141695, dated Mar. 19, 2014.
Taiwan Office Action for 100138311, dated Jun. 27, 2014.
Taiwan Office Action for 100140428, dated Jan. 26, 2015.
Taiwan Office Action for 102106326, dated Sep. 8, 2015.
Taiwan Office Action for 103103350, dated Mar. 21, 2016.
Campos et al., "System in Package Solutions Using Fan-Out Wafer Level Packaging Technology," SEMI Networking Day, Jun. 27, 2013.
Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.
Bang, U.S. Appl. No. 10/656,534, filed Sep. 5, 2003.
Brochure, "High Performance BVA PoP Package for Mobile Systems," Invensas Corporation, May 2013, 20 pages.
Brochure, "Invensas BVA PoP for Mobile Computing: Ultra High IO Without TSVs," Invensas Corporation, Jun. 26, 2012, 4 pages.

(56) References Cited

OTHER PUBLICATIONS

Brochure, "Invensas BVA PoP for Mobile Computing: 100+ GB/s BVA PoP," Invensas Corporation, c. 2012, 2 pages.
Campos et al., "System in Package Solutions Using Fan-Out Wafer Level Packaging Technology," SEMI Networking Day, Jun. 27, 2013, 31 pages.
Chinese Office Action for Application No. 201180022247.8 dated Sep. 16, 2014.
Chinese Office Action for Application No. 201180022247.8 dated Apr. 14, 2015.
Chinese Office Action for Application No. 201310264264.3 dated May 12, 2015.
EE Times Asia "3D Plus Wafer Level Stack" [online] [Retrieved Aug. 5, 2010] Retrieved from internet: <http://www.eetasia.com/ART_8800428222_280300_NT_DEC52276.htm>, 2 pages.
Extended European Search Report for Appln. No. EP13162975, dated Sep. 5, 2013.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report for Appln. No. PCT/US2005/039716, dated Apr. 5, 2006.
International Search Report and Written Opinion for Appln. No. PCT/US2011/024143, dated Sep. 14, 2011.
International Search Report and Written Opinion for Appln. No. PCT/US2011/024143, dated Jan. 17, 2012.
International Search Report and Written Opinion for Appln. No. PCT/US2011/060551, dated Apr. 18, 2012.
International Search Report and Written Opinion for Appln. No. PCT/US2011/044342, dated May 7, 2012.
International Search Report and Written Opinion for Appln. No. PCT/US2011/044346, dated May 11, 2012.
International Search Report and Written Opinion for Appln. No. PCT/US2012/060402, dated Apr. 2, 2013.
International Search Report and Written Opinion for Appln. No. PCT/US2013/026126, dated Jul. 25, 2013.
International Search Report and Written Opinion for Appln. No. PCT/US2013/052883, dated Oct. 21, 2013.
Taiwan Search Report for 105128420, dated Sep. 26, 2017.

\* cited by examiner

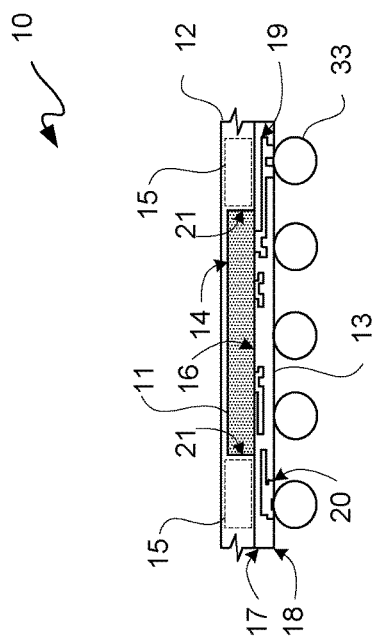
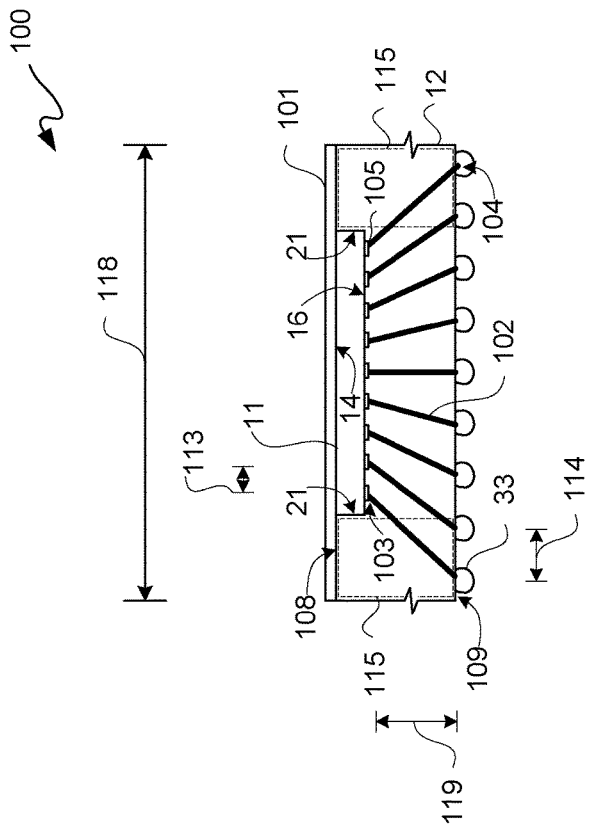
FIG. 1
FIG. 2

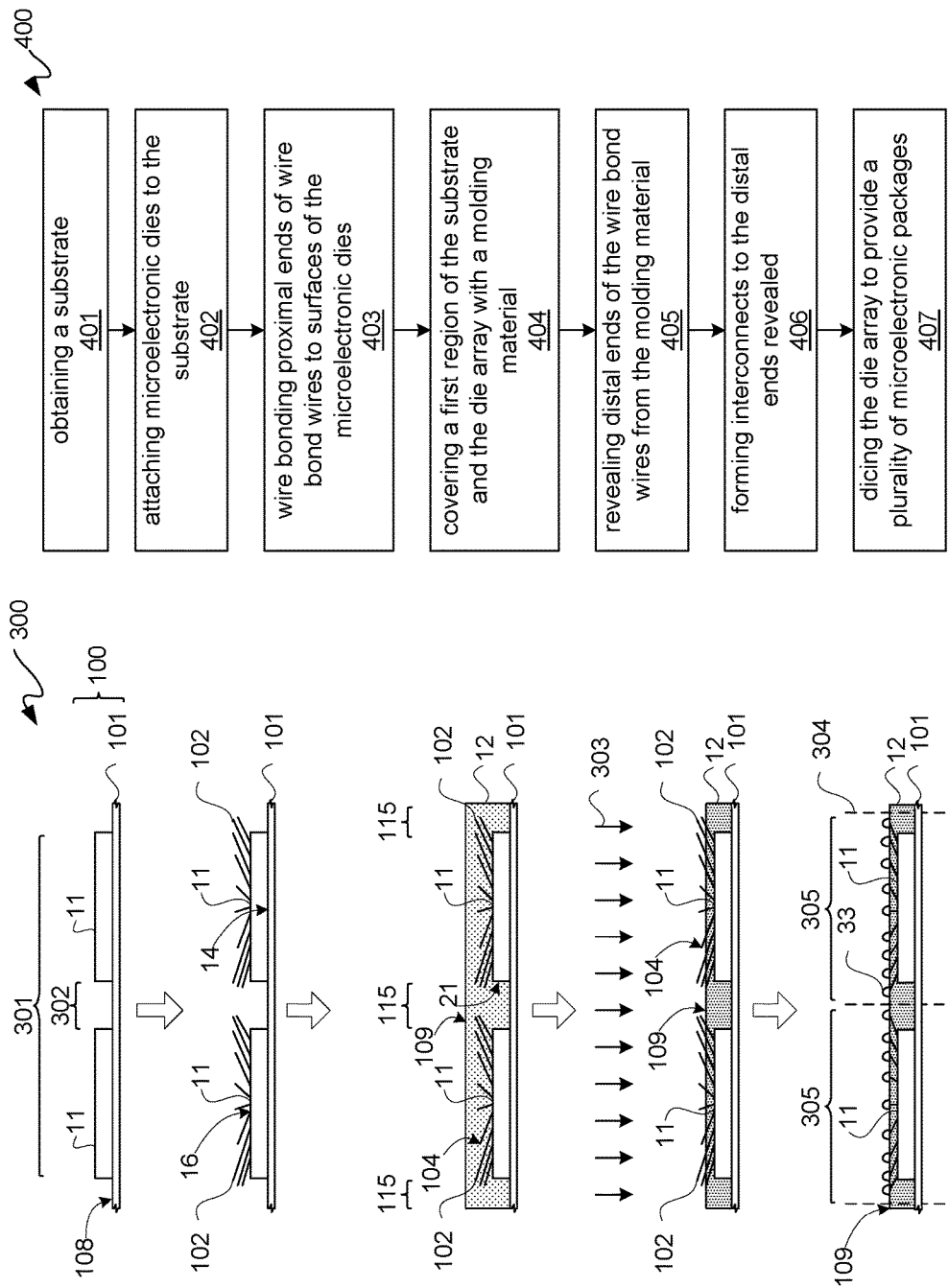

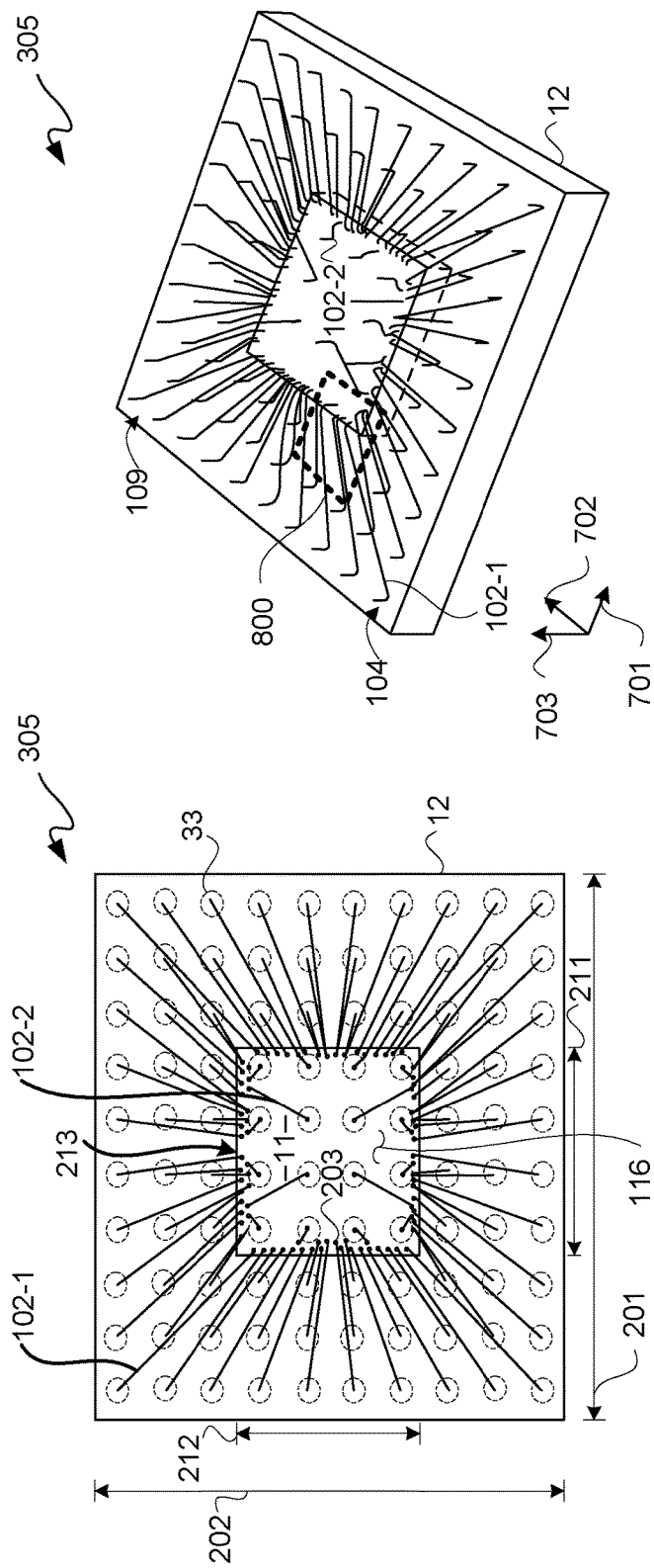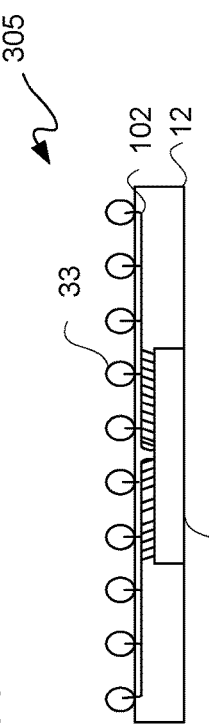

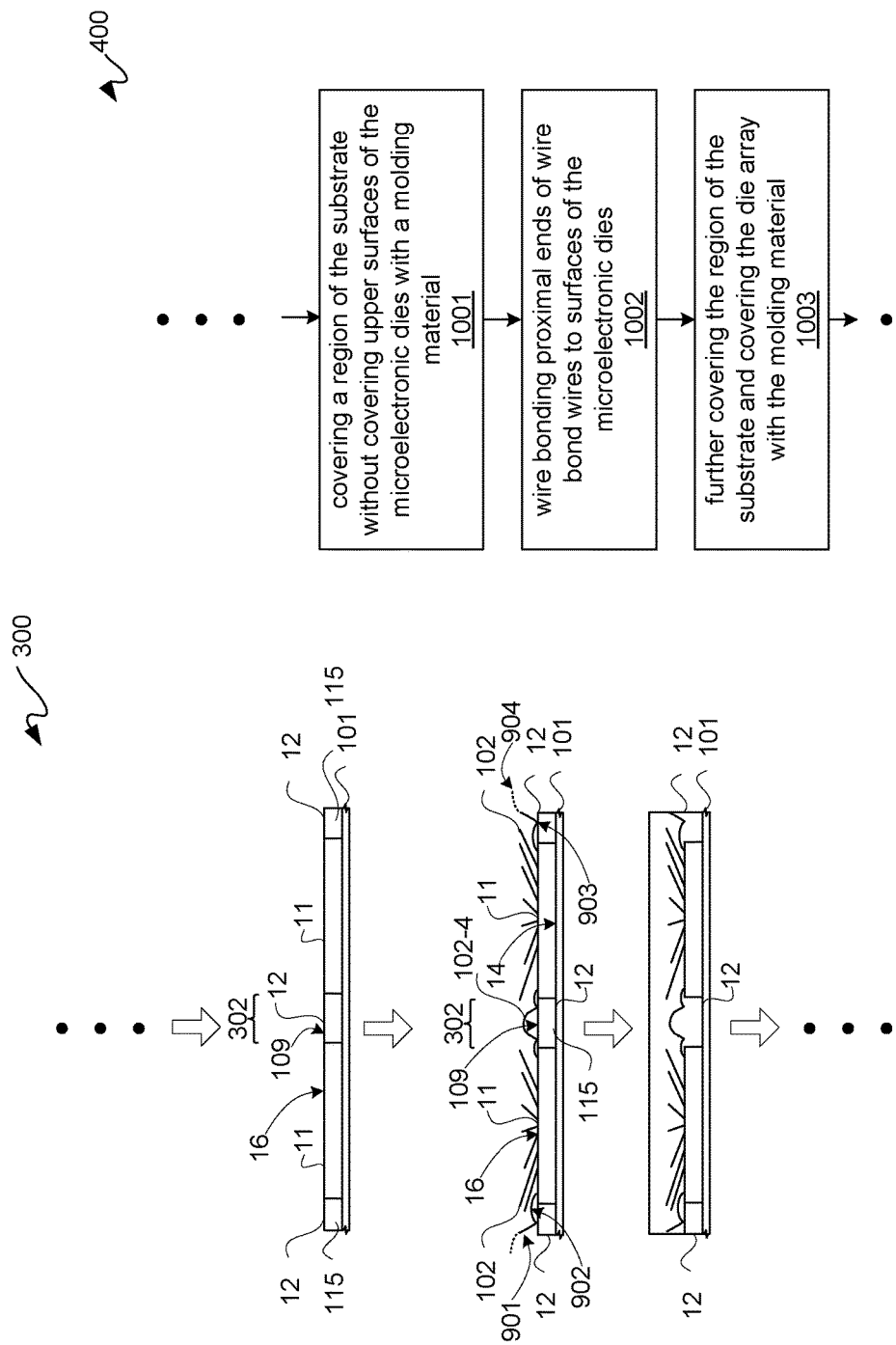

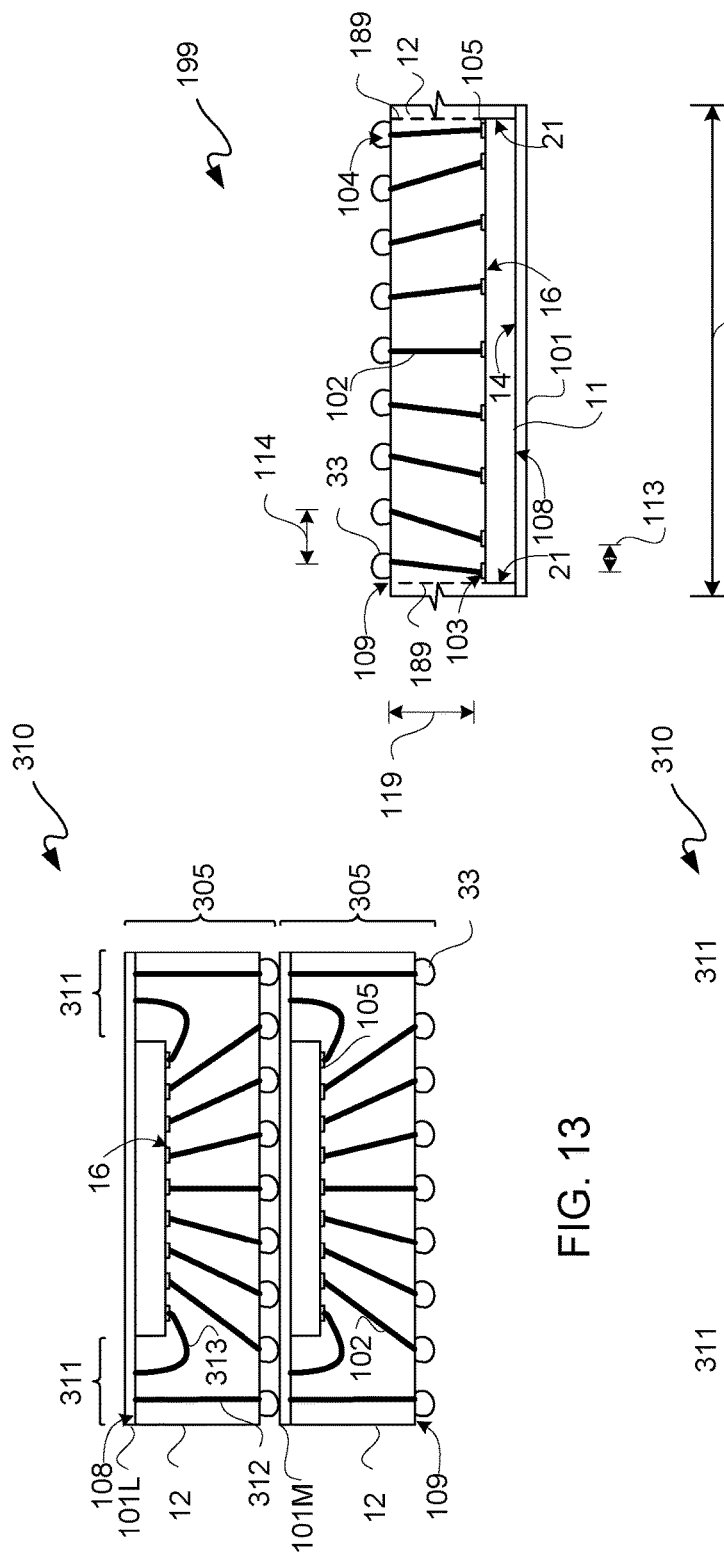

WAFER-LEVEL PACKAGING USING WIRE BOND WIRES IN PLACE OF A REDISTRIBUTION LAYER

CROSS-REFERENCE TO RELATED APPLICATION(S)

This application is a continuation of, and hereby claims priority to, pending U.S. patent application Ser. No. 14/701,049, filed on Apr. 30, 2015, the entirety of which is hereby incorporated by reference herein for all purposes.

FIELD

The following description relates to integrated circuits ("ICs"). More particularly, the following description relates to wafer-level packaging using wire bond wires in place of a redistribution layer for an IC.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), a printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example.

An RDL is a thin film technology, which conventionally involves masking operations, etching operations, and deposition operations. Accordingly, forming an RDL may add considerable cost to formation of a chip. Accordingly, it would be desirable and useful to provide a less costly form of interconnecting a chip than an RDL.

BRIEF SUMMARY

An apparatus relates generally to a microelectronic package. In such an apparatus, a microelectronic die has a first surface, a second surface opposite the first surface, and a sidewall surface between the first and second surfaces. A plurality of wire bond wires with proximal ends thereof are coupled to either the first surface or the second surface of the microelectronic die with distal ends of the plurality of wire bond wires extending away from either the first surface or the second surface, respectively, of the microelectronic die. A portion of the plurality of wire bond wires extends outside a perimeter of the microelectronic die into a fan-out ("FO") region. A molding material covers the first surface, the sidewall surface, and portions of the plurality of the wire bond wires from the first surface of the microelectronic die to an outer surface of the molding material.

A method relates generally to wafer-level packaging. In such a method, a substrate is obtained. Microelectronic dies are attached to the substrate to form a die array of the microelectronic dies having gaps between neighboring dies of the microelectronic dies. Proximal ends of wire bond wires are wire bonded to the microelectronic dies. The substrate, including the die array, is covered with a molding material. The covering includes covering at least a majority length of lengths of the wire bond wires wire bonded to the microelectronic dies. At least a portion of the wire bond wires extend outside corresponding perimeters of the microelectronic dies corresponding thereto. Distal ends of the wire bond wires are revealed from the molding material. Interconnects are formed for the distal ends revealed. The die array is diced to provide microelectronic packages.

Other features will be recognized from consideration of the Detailed Description and Claims, which follow.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 1 is a schematic diagram depicting a cross-sectional side view of a portion of a conventional reconstitute wafer.

FIG. 2 is a schematic diagram depicting a cross-sectional side view of a portion of a reconstitute wafer.

FIG. 3 is a progression of cross-sectional side views depicting an exemplary wafer-level packaging ("WLP") process for a reconstituted wafer.

FIG. 4 is a flow diagram depicting another exemplary WLP process.

FIG. 7 is a top plan view depicting an exemplary in-process microelectronic package prior to completion of molding.

FIG. 8 is a perspective view depicting an exemplary in-process microelectronic package prior to completion of molding.

FIG. 9 is a side cross-sectional view depicting an exemplary microelectronic package after forming solder balls.

FIG. 10 is a progression of cross-sectional side views depicting further yet another exemplary WLP process for a reconstituted wafer.

FIG. 11 is a flow diagram depicting still further yet another exemplary WLP process.

FIGS. 12-1 through 12-3 are top plan views depicting respective exemplary microelectronic packages of different sizes.

FIG. 13 is a side cross-sectional view depicting an exemplary package-on-package ("PoP") microelectronic device.

FIG. 14 is a schematic diagram depicting a cross-sectional side view of a portion of a fan-in only package.

FIG. 15 is a side cross-sectional view depicting another exemplary PoP microelectronic device.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figures 3, 12:
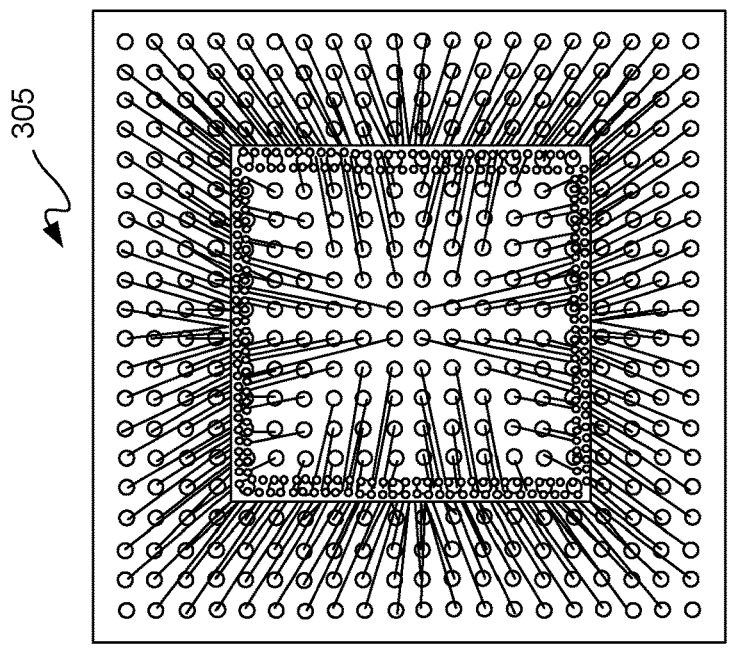
Figures 2, 12:
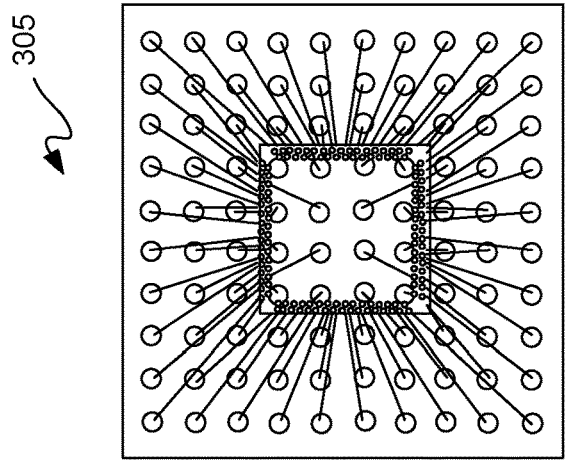
Figures 1, 12:
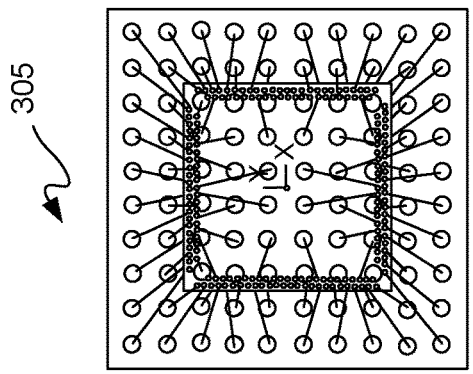

FIG. 1 is a schematic diagram depicting a cross-sectional side view of a portion of a conventional reconstituted wafer 10. Reconstituted wafer 10 is for fan-out WLP ("FO-WLP"). A microelectronic die or IC chip 11 may be encased between molding material 12 and an RDL 13. Microelectronic die 11 may have an upper surface 14 and a lower surface 16. Use of terms such as "upper" and "lower" or other directional terms is made with respect to the reference frame of the figures and is not meant to be limiting with respect to potential alternative orientations, such as in further assemblies or as used in various systems.

Lower surface 16 may generally be associated with what is referred to as a "front side" of an in-process wafer, and upper surface 14 may generally be associated with what is referred to as a "backside" of an in-process wafer. Along those lines, a front-side of an in-process wafer may be used for forming what is referred to as front-end-of-line ("FEOL") structures and back-end-of-line ("BEOL") structures.

Generally, BEOL structures may include one or more inter-level dielectrics ("ILDs") and one or more levels of metallization. Furthermore, each ILD may be composed of one or more dielectric layers. Additionally, metal from a metallization level may extend through one or more ILDs, as is known. Furthermore, each level of metallization may be composed of one or more metal layers. A passivation level may be formed on a last metallization layer. Such passivation level may include one or more dielectric layers, and further may include an anti-reflective coating ("ARC"). In some applications, such a passivation layer may be referred to as an inter-die layer.

An RDL 13 may be formed on such passivation level. Conventionally, an RDL 13 may include: a dielectric layer 17, such as a polyimide layer for example; a metal layer 19 on such dielectric layer 17 and connected to bond pads of a metal layer of a last metallization level of microelectronic die 11; and another dielectric layer 18, such as another polyimide layer for example, over such metal layer 19 while leaving a portion thereof exposed to provide bond pads 20. A terminal opening may expose such bond pads 20 of such RDL 13 metal layer 19. Thereafter, solder bumps, such as solder balls 33, or wire bonds may be coupled to such bond pads 20.

An RDL 13 metal layer 19, may be formed of a metal such as a copper, copper alloy, aluminum or other metal, and may be formed on such a passivation layer and on lower end contact surfaces of via conductors of microelectronic die 11. Balls 33 may be respectively formed on bonding pads 20, where such pads may be formed on or as part of metal layer 19. Balls 33 may be formed of a bonding material, such as solder or other bonding material. Balls 33 may be microbumps, C4 bumps, copper pillar bumps, ball grid array ("BGA") balls, or some other die interconnect structure. In some applications, metal layer 19 may be referred to as a landing pad.

Formation of an RDL 13 may include lithography, deposition, etch, planarization, among other known operations for formation of an RDL. For example, a seed layer deposition may be before patterning and electroplating to provide conductors for respective solder bump pads or landings. Optionally, a conventional anisotropic etch may be used prior to depositing and patterning a polymer isolation layer as a liner, and a chemical-mechanical-polishing ("CMP") may be used thereafter.

More recently, three-dimensional ("3D") ICs or "3D ICs" have been formed by generally attaching one die to another at a bond pad level or an on-chip electrical wiring level. Microelectronic dies 11 may be diced from a wafer into single dies. Such single dies may be directly coupled to one another or bonded to a platform to provide a reconstituted wafer 10. Along those lines, microelectronic dies 11 may be tested prior to inclusion in reconstituted wafer 10. Such pre-tested prior to inclusion microelectronic dies 11 are sometimes referred to as "known good dies" or "KGDs".

In other examples, one or more RDLs 13 may be formed. An RDL 13 may include numerous conductive traces extending on or within one or more dielectric sheets or layers. Such traces may be provided in one level or in multiple levels throughout a single dielectric layer, separated by portions of dielectric material within such RDL. Vias may be included in an RDL 13 to interconnect traces in different levels of such RDL.

For FO-WLP, reconstituted wafer 10 may have gaps between such dies in which molding material 12 is injected or otherwise deposited to provide a fan-out ("FO") region 15 generally around a sidewall or sidewall surface 21 of microelectronic dies 11 of such reconstituted wafer 10. Accordingly, formation of an RDL 13 for multiple microelectronic dies 11 of a reconstituted wafer 10 may add considerable cost.

FIG. 2 is a schematic diagram depicting a cross-sectional side view of a portion of a reconstituted wafer 100. Microelectronic dies 11 may include any of a variety of types of substrates. Examples of such material used for substrates may include silicon (Si), gallium arsenide (GaAs), polymeric, ceramic, carbon-based substrates such as diamond, a silicon carbon (SiC), germanium (Ge), $Si_{1-x}Ge_x$, or the like.

Microelectronic dies 11 may be coupled to a platform 101, such as a substrate 101. Substrate 101 may be a semiconductor substrate. Even though a semiconductor substrate may be used, any sheet or layer of semiconductor material or dielectric material, such as ceramic or glass for example, may be used as a substrate for WLP of reconstituted wafer 100. Furthermore, substrate 101 may, though need not, be present in a final structure.

Microelectronic die 11 may have an upper surface 14, a lower surface 16 opposite upper surface 14, and a sidewall surface 21 between such upper and lower surfaces. Upper surface 14 and lower surface 16 may extend in lateral directions and may be generally parallel to each other at a thickness of microelectronic die 11. Wire bond wires 102 may have proximal ends 103 of wire bond wires 102 coupled to lower surface 16 of microelectronic die 11 with distal ends 104 of wire bond wires 102 extending away from such lower surface 16 of microelectronic die 11. In another implementation, microelectronic die 11 may have proximal ends 103 of wire bond wires 102 coupled to an upper surface 14 of microelectronic die 11 with distal ends 104 of wire bond wires 102 extending away from such upper surface 14 of microelectronic die 11. However, for purposes of clarity and not limitation, it shall be assumed that wire bond wires 102 are coupled to BEOL pads 105 of microelectronic die 11 as part of lower surface 16.

Sidewall surface 21 may define a perimeter of microelectronic die 11. A portion of wire bond wires 102 may extend outside such perimeter die into a FO region 115. Along those lines, a molding material 12 may be injected or otherwise deposited for covering lower surface 16, sidewall surface 21, and wire bond wires 102 from proximal ends 103 coupled to lower surface 16 of microelectronic die 11 to an outer surface 109 of molding material 12 generally opposite an inner surface 108 of substrate 101. An outer perimeter of FO region 115 may extend to an outer perimeter 118 of molding material 12 coverage around a final structure. In other words, generally FO region 115 may provide a 0.1 mm or more extension region or ring around a corresponding microelectronic die 11 after dicing a package from a reconstituted wafer.

FIG. 14 is a schematic diagram depicting a cross-sectional side view of a portion of a fan-in only package 199. FO region 115 is eliminated in fan-in only package 199. As many of the details regarding fan-in only package 199 are the same as described with reference to FIG. 2, generally such description is not repeated.

In this example, wire bond wires 102 extend over a lower surface 16 of microelectronic die 11. Again, substrate 101 may or may not be present in a final structure of fan-in only package 199. In this implementation, outer perimeter of molding material coverage around a final structure is at least 0.1 mm or more wider than microelectronic die 11. In other words, molding material 12 is at least 0.1 mm thick along sidewall surface 21 of microelectronic die 11. Wire bond wires 102 may be for coupling fan-in only package 199 to another circuit platform. In another implementation, molding material 12 may not be disposed outside of microelectronic die 11 along sidewall surface, as generally indicated by dashed lines 189. In such an implementation, molding material 12, as well as a bond via array ("BVA") structure of wire bond wires 102 partially encased in such molding material 12, may be disposed only over lower surface 16 of microelectronic die 11, where wire bond wires 102 may be formed for example on microelectronic dies 11 of a silicon wafer for WLP in contrast to a reconstituted wafer.

For purposes of clarity and not limitation, reconstituted wafer 100 of FIG. 2 is further described, as such description may likewise apply to fan-in only package 199 of FIG. 14.

Interconnects 33 may be coupled to distal ends 104 of wire bond wires 102. In this example, interconnects 33 may be solder balls 33. However, in another implementation, interconnects may be microbumps or another form of interconnects. Furthermore, in another implementation, contacts, such as metal pads, may be formed on outer surface 109 for coupling distal ends 104 to solder balls 33.

A minimum pitch 114 of some of the distal ends 104 may be at least a factor of 3 times greater than a minimum pitch 113 of proximal ends 103. Pitch 114 may be at least approximately 300 microns for interconnects 33, including ball grid array ("BGA") interconnects. Pitch 113 may be at most approximately 100 microns. Wire bond wires 102 may have a thickness in a range of approximately 15 to 50 microns. Such thicknesses may be substantially thicker than traces or wires in a conventional RDL.

Upper surface 14 of microelectronic die 11 may be coupled to an inner surface 108 of substrate 101. Molding material 12 may cover a portion of inner surface 108 of substrate 101 associated with FO region 115.

Wire bond wires 102 may be used instead of an RDL. Accordingly, no RDL need be used for WLP wire routing. Rather, wire bond wires 102 may be used. Additional thickness 119 added to reconstituted wafer 100 in comparison to a conventional reconstituted wafer 10 of FIG. 1 may be less than approximately 200 to 300 microns.

FIG. 3 is a progression of cross-sectional side views depicting an exemplary WLP process 300 for a reconstituted wafer 100. FIG. 4 is a flow diagram depicting an exemplary WLP process 400, which may correspond to WLP process 300 of FIG. 3. FIGS. 3 and 4 are further described with simultaneous reference to FIGS. 1 through 4.

At 401, a substrate 101 is obtained. At 402, microelectronic dies 11 may be attached, such as by epoxy, laminate or other adhesives in the form of film, tape or paste, to surface 108 of substrate 101 to form a die array 301 of microelectronic dies 101 to provide a reconstituted wafer 100. Gaps 302 may exist between sidewall surfaces 21 of neighboring dies of microelectronic dies 11.

At 403, proximal ends 103 of wire bond wires 102 may be wire bonded to upper surfaces 16 of microelectronic dies 11. Wire bonding at 403 may be stitch bonding and/or ball bonding.

At 404, an exposed area of substrate 101, including in gaps 302, as well as exposed surfaces of microelectronic dies 11 of die array 301 may be covered, by injection or other deposition, with a molding material 12. Such covering at 404 may include covering at least a majority length of lengths of wire bond wires 102, where such wire bond wires 102 have previously been wire bonded at 403 to then exposed or otherwise accessible surfaces of microelectronic dies 11 for such wire bonding. For an injection molding at 404, such injection molding may be performed without a film assist for release of a mold thereof.

At least a portion of such wire bond wires 102 attached to a microelectronic die 11, namely such portion of wire bond wires 102 wire bonded at 403, may extend outside or beyond a perimeter of such microelectronic die 11. At least such a portion of wire bond wires 102 may extend over gaps 302 of die array 301.

At 405, distal ends 104 of wire bond wires 102 may be revealed from molding material 12. This reveal may be performed with an etch back 303 of molding material 12 in this example to remove an upper potion thereof for revealing distal ends 104. This etch back 303 may be a plasma ("dry") etch or a chemical bath ("wet") etch. However, in another implementation, a polishing, such as a CMP, may be used for such reveal.

At 406, interconnects 33 may be formed for direct or indirect contact with or to distal ends 104 revealed at 405. Along those lines, this forming may include a printing of solder or a ball drop followed by reflow, as is known.

At 407, die array 301, which may or may not include substrate 101 may be diced 304 for singulation. This dicing may involve cuts, whether mechanical, laser, or otherwise, in gaps 302 to provide separate microelectronic packages 305. In this implementation, substrate 101 is diced, and thus sections of substrate 101 are included in microelectronic packages 305. Even though a single microelectronic die 11 per microelectronic package 305 is illustratively depicted, in another implementation more than one microelectronic die 11 per microelectronic package 305 may be used, which implementation may result for example by alternately not dicing between neighboring microelectronic dies 11.

However, substrate 101 may be removed prior to dicing at 407, and such substrate 101 may then be reused for another iteration of WLP process 300. For example, substrate 101 may be penetrated with UV rays and adhesive used to attach microelectronic dies 11 may be a UV soluble adhesive for release of substrate 101 after molding at 404. For providing a reconstituted wafer 100, substrate 101 may be a carrier wafer, and microelectronic dies 11 may be known good dies. Thus, microelectronic packages 305 may be diced from a reconstituted WLP with FO regions 115 associated with gaps 302, including sidewall surfaces 21 corresponding to portions of a perimeter of die array 301 proximal to a wafer's edge.

Figures 5, 6:
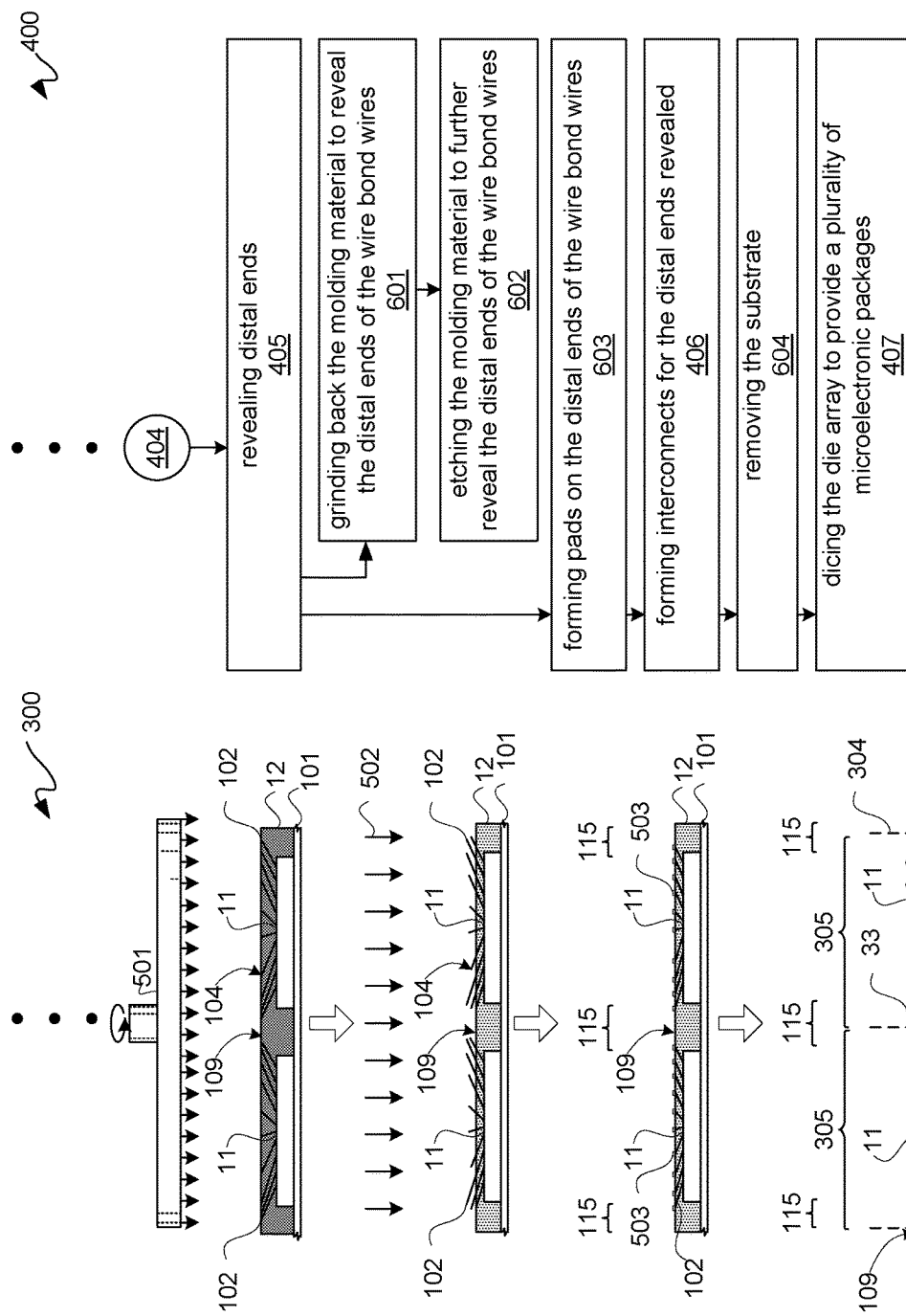
FIG. 5 is a progression of cross-sectional side views depicting yet another exemplary WLP process.
FIG. 6 is a flow diagram depicting still yet another exemplary WLP process.

FIG. 5 is a progression of cross-sectional side views depicting an exemplary WLP process 300 for a reconstituted wafer 100. FIG. 6 is a flow diagram depicting an exemplary WLP process 400, which may correspond to WLP process 300 of FIG. 5. WLP processes 300 and 400 respectively of FIGS. 3 and 4 have same operations up to and including covering a region of a substrate 101 and a die array 301 with a molding material 12. However, after operation 404, such processing is different as described below in additional detail. Accordingly, description of such same operations is not repeated for clarity. WLP processes 300 and 400 respectively of FIGS. 5 and 6 are further described with simultaneous reference to FIGS. 2 through 4.

At 405, distal ends 104 of wire bond wires 102 may be revealed from molding material 12. This reveal may be performed at 601 with a grinding back 501 of an upper surface 109 of molding material 12 to reveal distal ends 104 of wire bond wires 102. However, in another implementation, a polishing, such as a CMP, may be used for such reveal. After such a grind back at 601, a reveal at 405 may include at 602 an etch back of molding material 12 using etch 502, in this example to remove an upper portion of molding material 12 for revealing distal ends 104. This etch back at 602 may be a plasma ("dry") etch or a chemical bath ("wet") etch.

After revealing at 405, at 603 pads 503 may be formed on or at distal ends 104 of wire bond wires 102. This forming of pads 503 may be on an upper surface 109 of molding layer 12. Such forming may include forming a masking layer followed by seeding and electroplating or deposition of a metal, as is known.

At 406, interconnects 33 may be formed on pads 503 for coupling to distal ends 104 revealed at 405. Along those lines, this forming may include a printing of solder or a ball drop followed by reflow, as is known.

At 604, substrate 101 may be removed. Substrate 101 may be removed prior to dicing at 407 and sometime after molding at 404, and such substrate 101 may then be reused for another iteration of WLP process 300. For example, substrate 101 may be a glass or other translucent material capable of being penetrated with UV rays. An adhesive used to attach microelectronic dies 11 to substrate 101 may be a UV soluble adhesive for release of substrate 101 at 604 sometime after molding at 404 and prior to dicing at 407.

At 407, die array 11 may be diced 304 for singulation. This dicing may involve cuts, whether mechanical, laser, or otherwise, in gaps 302 to provide separate microelectronic packages 305. In this implementation, substrate 101 is not diced, and thus sections of substrate 101 are not included in microelectronic packages 305.

For providing a reconstituted wafer 100, substrate 101 may be a carrier wafer, and microelectronic dies 11 may be known good dies. Thus, microelectronic packages 305 may be diced from a reconstituted WLP with FO regions 115 associated with gaps 302, including sidewall surfaces 21 corresponding to portions of a perimeter of die array 301.

FIG. 7 is a top plan view depicting an exemplary in-process microelectronic package 305 prior to completion of molding. FIG. 8 is a perspective view depicting an exemplary in-process microelectronic package 305 prior to completion of molding. FIG. 9 is a side cross-sectional view depicting an exemplary microelectronic package 305 after forming solder balls 33. Microelectronic package 305 of FIGS. 7 through 9 is further described with simultaneous reference to FIGS. 2 through 9.

Positional accuracy of wire bond wires 102 when made as generally straight vertical wires from a surface of a microelectronic die 11 may be: approximately +/−20 microns in an x-direction 701; approximately +/−20 microns in a y-direction 702 with reference to corresponding contact pads 203 of microelectronic die 11 in an x-y plane of surface 16 of microelectronic die 11; and approximately +/−40 microns in a z-direction 703 orthogonal to such x-y plane. Width 211 and length 212 of microelectronic die 11 may each be respectively equal to or smaller than width 201 and length 202 of microelectronic package 305. From the above description, it should be appreciated that BGA pitch may be substantially larger than pitch of contacts 203. Accordingly, a substantial amount of alignment tolerance is provided for distal ends 104 of wire bond wires 102. However, for dense contact areas, wire bond wires 102 may be reduced in one or more solder ball 33 depopulation regions, such as region 800, for example.

Wire bond wires 102 may include slanted-out wire bond wires 102-1 and/or slanted-in wire bond wires 102-2. Microelectronic die 11 may have a perimeter 213, and proximate to such perimeter may be contacts 203. In this example, contracts 203 are distributed around such perimeter 213 of microelectronic die 11; however, in another implementation, such contacts 203 may not be proximate to all edges of perimeter 213 of microelectronic die 11.

Slanted-in wire bond wires 102-2 extend from such contacts 203 to a fan-in ("FI") region 116 ending over a surface area associated with contacts 203 within perimeter 213 of microelectronic die 11. Slanted-in wire bond wires 102-2, which may include touched-down transverse-upward formed wires, may extend over a central region of surface 16 of microelectronic die 11 inside perimeter 213 into an FI region 116.

Slanted-out wire bond wires 102-1 extend from such contacts 203 to an FO region 115 ending outside a surface area associated with contacts 203 within perimeter 213 of microelectronic die 11. For slanted-out wire bond wires 102-1, such slanted-out wire bond wires 102-1 may include generally transverse portions prior to a touched-down contact point to an upper surface 109 of molding material 12, and from such contact point, such touched-down wires may be formed in an upward direction to provide a distal end 104. For slanted-in wire bond wires 102-2, such contact point may be on a surface 16 of microelectronic die 11. Wire bond wires 102 may be coupled to contacts 203 with either or both ball bonding or stitch bonding to such contracts 203 of microelectronic die 11. As shown in FIGS. 7-9 the bond wires 102-1 and 102-2 may have one or more portions that are bent or kinked connecting portions that are generally more parallel to the surface of the microelectronic package 305 or microelectronic die 11 with other portions that are generally more perpendicular to the surface of the microelectronic package 305 or microelectronic die 11.

FIG. 10 is a progression of cross-sectional side views depicting an exemplary WLP process 300 for a reconstituted wafer 100. FIG. 11 is a flow diagram depicting an exemplary WLP process 400, which may correspond to WLP process 300 of FIG. 10. WLP processes 300 and 400 respectively of FIGS. 10 and 11 may have same operations as described in FIGS. 3 and 4 for further covering a region of a substrate 101 and covering a die array 301 with a molding material 12. As operations 401 and 402 may be the same as previously described, such description is not repeated for purposes of clarity. Furthermore, operations after operation 404 may be the same, and so such description is not repeated for purposes of clarity. WLP process 300 and 400 respectively of FIGS. 10 and 11 is further described with simultaneous reference to FIGS. 2 through 11.

At 1001, a region of substrate 101, including gaps 302, is covered with a molding material 12. Such molding material 12 may be injected to be generally level with surface 16.

At 1002, wire bond wire may be drawn with proximal ends 103 bonded to contacts 203 of microelectronic die 11 followed by drawing such wire bond wire to form wire bond wires 102. For some wire bond wires 102, they may be drawn generally traverse with respect to surface 16 and surface 109 to a touch-down contact point 903 on surface 109. This traverse section 902 of such wire bond wires 102 may extend into a FO region 115. From touch-down contact point 903 on surface 109, wire bond wire 102 may be drawn away, such as upwardly for example, from surface 109 to form an upward section 901 of such wire bond wires 102. Because formation of wire bond wires 102 may be continuous as between microelectronic dies 11 over gaps 302, some wire bond wires 102-4 may extend to a neighboring microelectronic die 11 until being severed, such as by dicing, to provide separate wire bond wires 102-1 for such neighboring microelectronic dies 11. This continuation of a wire bond wire 102 to a neighboring die for a subsequent touch-down followed by a subsequent bonding is generally indicated by dashed line 904.

At 1003, such FO region 115 may be further covered with molding material 12 along with covering die array 301, as well as wire bond wires 102, with such molding material. Molding material 12 may have a thickness above surface 16 of microelectronic die 11 of at least 50 microns in some implementations.

FIGS. 12-1 through 12-3 are top plan views depicting respective exemplary microelectronic packages 305 of different sizes. For purposes of clarity and not limitation, underlying components, such as wire bond wires 102, contacts 203, and microelectronic dies 11 for example, in such microelectronic packages 305 of different sizes of microelectronic dies 11 are illustratively shown. For example, a die size of microelectronic die 11 may be in a range of approximately 1-by-1 to 12-by-12 millimeters. A package size associated with such microelectronic packages 305 may in a range of approximately 1-by-1 to 30-by-30 millimeters. Accordingly, use of wire bond wires 102 in place of an RDL is scalable for different die sizes and different package sizes. Along those lines, any of a variety of pin counts, namely number of contacts 203, may be used, which may vary from microelectronic die-to-microelectronic die.

FIG. 13 is a side cross-sectional view depicting an exemplary package-on-package ("PoP") microelectronic device 310. FIG. 13 is described further with simultaneous reference to FIGS. 2 through 13.

In FIG. 13, at least two microelectronic packages 305 are stacked one on top of another in a columnar alignment. Solder balls 33 of an upper microelectronic package 305 may be interconnected to a substrate 101M of a lower microelectronic package 305. Substrate 101M may include an organic substrate, tape, RDL, and/or the like to provide additional contact pads and routing (not shown for purposes of clarity and not limitation) for coupling between microelectronic packages 305. FO regions 115 of upper and lower microelectronic packages 305 may be aligned to one another to provide avenues 311 for routing.

For a PoP microelectronic device 310, each of microelectronic packages 305 may optionally include wire bond wires 312 and/or 313. Wire bond wires 312 may extend from corresponding solder balls 33 along an outer surface 109 of molding material 12 through molding material 12 to an inner surface 108 of a substrate 101 of a microelectronic package 305. Wire bond wires 313 may extend between BEOL pads 105 of microelectronic die 11 as part of lower surface 16 to an inner surface 108 of substrate. In certain implementations, the top package may not have peripheral wire bond wires 312 or 313.

FIG. 15 is a side cross-sectional view depicting another exemplary PoP microelectronic device 310. FIG. 15 is described further with simultaneous reference to FIGS. 2 through 15.

In FIG. 15, at least two microelectronic packages 305 are stacked one on top of another in a microelectronic die 11 alignment. Even though same microelectronic dies 11 are used in this example for both of microelectronic packages, such as for stacked memory dies for example, in another implementation different microelectronic dies may be used. Along those lines, different microelectronic packages 305 may be used with same or different microelectronic dies 11. Micro bumps 314 or other solder masses may be disposed on upper surface 14 of a lower microelectronic die 11 of a lower microelectronic package 305 for interconnecting with distal ends of wire bond wires 102 of an upper microelectronic package 305. In this configuration, lower microelectronic die 11 may have through substrate vias (not shown) for interconnecting a substrate 315 of such microelectronic die 11 of such lower microelectronic package 305 to such distal ends of wire bond wires 102 of such upper microelectronic package 305.

In this example implementation, a lower microelectronic package 305 does not have a substrate 101, and an upper microelectronic package 305 includes a substrate 101. In this example implementation, FO regions 115 of upper and lower microelectronic packages 305 may be aligned to one another to provide avenues 311 for routing, including without limitation through PoP routed wire bond wires 312. Wire bond wires 312 may extend substantially beyond molding material 12 of upper microelectronic package 305, and may be inserted into corresponding holes in molding material 12 of lower microelectronic package 305, as generally delineated with a dashed line. These holes may subsequently be filled with additional molding material 12 or other fill material. Moreover, upper microelectronic package 305 may include wire bond wires 313, as previously described.

Figure 16:
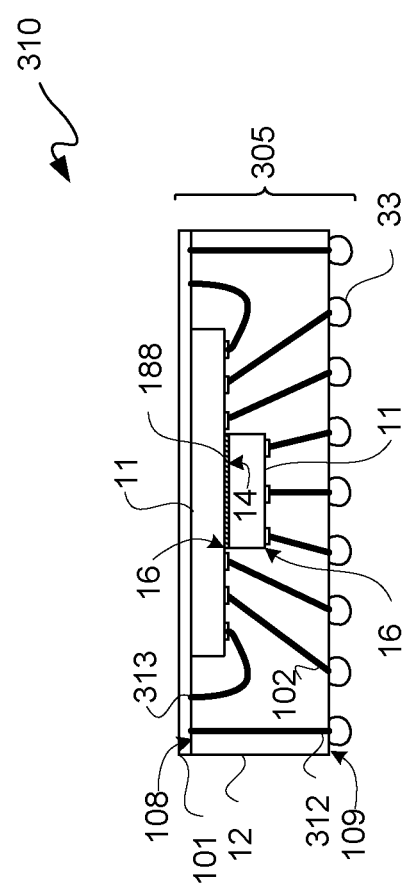
FIG. 16 is a side cross-sectional view depicting an exemplary stacked die microelectronic device.

FIG. 16 is a side cross-sectional view depicting an exemplary stacked die microelectronic device 310. FIG. 16 is described further with simultaneous reference to FIGS. 2 through 16.

A bonding layer 188 or other interface layer may be disposed on upper surface 14 of a lower microelectronic die 11 and a lower surface 16 of an upper microelectronic die 11 to provide a microelectronic package 305. In this example implementation, an FO region 115 of lower microelectronic die 11 may be within an FI region of a larger upper microelectronic die 11. Wire bond wires 312 may extend from lower surfaces 16 of microelectronic dies 11 beyond molding material 12. Other features of microelectronic package 305 have been previously described, and thus are not repeated for purpose of clarity and not limitation.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A microelectronic package, comprising:
    a microelectronic die having a first surface and a second surface opposite the first surface;
    a plurality of wire bond wires with proximal ends thereof coupled to the first surface of the microelectronic die with distal ends of the plurality of wire bond wires extending away from the first surface of the microelectronic die;
    a first pitch of the distal ends being at least a factor of 3 times greater than a second pitch of the proximal ends; and
    a portion of the plurality of wire bond wires extending outside a perimeter of the microelectronic die into a fan-out ("FO") region.

2. The microelectronic package according to claim 1, further comprising:
    a molding material for covering the first surface and portions of the plurality of the wire bond wires from the first surface of the microelectronic die to an outer surface of the molding material; and
    interconnects coupled to the distal ends of the plurality of wire bond wires.

3. The microelectronic package according to claim 2, further comprising:
    a substrate;
    wherein the second surface of the microelectronic die is coupled to a surface of the substrate; and
    wherein the molding material covers a portion of the surface of the substrate associated with the FO region.

4. The microelectronic package according to claim 1, wherein the plurality of wire bond wires include both slanted-out wire bond wires extending to the FO region and slanted-in wire bond wires extending to a fan-in ("FI") region.

5. The microelectronic package according to claim 1, wherein:
    the first pitch is at least approximately 300 microns; and
    the second pitch is at most approximately 100 microns.

6. The microelectronic package according to claim 1, wherein:
    at least a majority of contacts of the microelectronic die are disposed on the first surface of the microelectronic die proximal to the perimeter thereof with no or a minority of the contacts in a central region of the first surface of microelectronic die;
    the portion of the plurality of wire bond wires is a first portion thereof; and
    a second portion of the plurality of wire bond wires extend over the central region of the first surface of the microelectronic die inside the perimeter of the microelectronic die into a fan-in ("FI") region.

7. A microelectronic package, comprising:
    a microelectronic die having a first surface and a second surface opposite the first surface;
    a plurality of wire bond wires with proximal ends thereof coupled to the first surface of the microelectronic die with distal ends of the plurality of wire bond wires extending away from the first surface of the microelectronic die;
    a first pitch of the distal ends being at least a factor of 3 times greater than a second pitch of the proximal ends; and
    a portion of the plurality of wire bond wires extending inside a perimeter of the microelectronic die into a fan-in ("FI") region as slanted-in wire bond wires extending to the FI region.

8. The microelectronic package according to claim 7, further comprising:
    a molding material for covering the first surface and portions of the plurality of the wire bond wires from the first surface of the microelectronic die to a surface of the molding material; and
    interconnects coupled to the distal ends of the plurality of wire bond wires.

9. The microelectronic package according to claim 8, further comprising:
    a substrate;
    wherein the second surface of the microelectronic die is coupled to a surface of the substrate; and
    wherein the molding material covers a portion of the surface of the substrate associated with the FI region.

10. The microelectronic package according to claim 7, wherein:
    the first pitch is at least approximately 300 microns; and
    the second pitch is at most approximately 100 microns.

11. The microelectronic package according to claim 7, wherein:
    at least a majority of contacts of the microelectronic die are disposed on the first surface of the microelectronic die proximal to the perimeter thereof with no or a minority of the contacts in a central region of the first surface of microelectronic die; and
    the portion of the plurality of wire bond wires extend over the central region of the first surface of the microelectronic die inside the perimeter of the microelectronic die into the FI region.

12. A package-on-package microelectronic device having the microelectronic package according to claim 7 as a first microelectronic package, the package-on-package device comprising:
    the first microelectronic package stacked on a second microelectronic package.

13. A package-on-package microelectronic device having the microelectronic package according to claim 7 as a first microelectronic package, the package-on-package device comprising:
    a second microelectronic package stacked on the first microelectronic package.

* * * * *